(12) United States Patent
Li et al.

(10) Patent No.: US 8,058,921 B2
(45) Date of Patent: Nov. 15, 2011

(54) FUSE CIRCUITS

(75) Inventors: Guo Xing Li, Sunnyvale, CA (US); Songtao Chen, Shenzhen (CN)

(73) Assignee: O2Micro, Inc., Santa Clara, CA (US)

( * ) Notice: Subject to any disclaimer, the term of this patent is extended or adjusted under 35 U.S.C. 154(b) by 0 days.

(21) Appl. No.: 12/463,071

(22) Filed: May 8, 2009

(65) Prior Publication Data

US 2010/0283531 A1 Nov. 11, 2010

(51) Int. Cl.
*H01H 37/76* (2006.01)
*H01H 85/00* (2006.01)

(52) U.S. Cl. ...................................................... 327/525

(58) Field of Classification Search .......... 327/525–526; 365/225.7
See application file for complete search history.

(56) References Cited

U.S. PATENT DOCUMENTS

| | | | | |
|---|---|---|---|---|
| 6,054,893 | A * | 4/2000 | Singh | 327/525 |
| 6,208,549 | B1 * | 3/2001 | Rao et al. | 365/96 |
| 6,462,527 | B1 * | 10/2002 | Maneatis | 323/315 |
| 7,129,768 | B2 * | 10/2006 | Yoon | 327/525 |
| 7,525,368 | B2 * | 4/2009 | Shih | 327/525 |
| 2002/0041198 | A1 * | 4/2002 | Parris et al. | 327/408 |
| 2008/0036527 | A1 * | 2/2008 | Nishihara et al. | 327/525 |
| 2010/0085107 | A1 * | 4/2010 | Huang et al. | 327/525 |

* cited by examiner

*Primary Examiner* — Quan Tra

(57) ABSTRACT

A fuse circuit includes a fuse having an intact state and a blown state. The fuse can be switched to the blown state by enabling a blowing current to flow through the fuse. The fuse is coupled between a first transistor and a second transistor in series. The first transistor and the second transistor are complementary transistors and operable for reducing an electrostatic discharge current flowing through the fuse. The first transistor and the second transistor are turned on to enable the blowing current to flow through the fuse.

22 Claims, 7 Drawing Sheets

FUSE CIRCUITS

BACKGROUND

Fuse circuits can be used in a variety of semiconductor applications, e.g., memory devices or programmable logic devices. For example, memory devices can include fuse circuits for providing fuse data. FIG. 1 illustrates a block diagram of a conventional fuse circuit 100.

In FIG. 1, a transistor 104, e.g., a PMOS transistor, is coupled to a node of a fuse 102 for providing a blowing current $I_B$ to the fuse 102 in response to a trimming signal. The trimming signal can be input to a gate of the transistor 104 via inverters 110 and 112. A power supply can be connected to a source of the transistor 104 for providing an input voltage VDD to the transistor 104. Another node of the fuse 102 is connected to ground. A transistor 106, e.g., a PMOS transistor, is coupled to the fuse 102 for providing a reading current $I_R$ ($I_R < I_B$) to the fuse 102. A bias voltage VB can be provided to a gate of the transistor 106. The power supply can be connected to a source of the transistor 106 for providing the input voltage VDD to the transistor 106. Furthermore, an inverter 108 is coupled to the fuse 102 to detect a voltage drop across the fuse 102 and output a signal according to the voltage drop.

The fuse 102 has an intact state and a blown state. If the fuse 102 is blown, resistance of the fuse 102 can be relatively high, e.g., 100KΩ. Otherwise, the resistance of the fuse 102 can be relatively low, e.g., 100Ω. That is, the fuse 102 exhibits a highly resistive condition or a short circuit condition. If the trimming signal is asserted, the transistor 104 can be turned on to enable the blowing current $I_B$ to flow through the fuse 102 to blow the fuse 102. In order to detect whether the fuse 102 is in the blown state or in the intact state, the transistor 106 can provide the current $I_R$ flowing through the fuse 102. The inverter 108 can generate a signal indicative of the states of the fuse 102 according to the voltage drop across the fuse 102. If the voltage drop across the fuse 102 is lower than a predetermined level $V_{THR}$, e.g., 1V, the fuse 102 can be determined in the intact state. The inverter 108 can provide a logic high signal at OUT. If the voltage drop across the fuse 102 is higher than the predetermined level $V_{THR}$, the fuse 102 can be determined in the blown state. The inverter 108 can provide a logic low signal at OUT.

However, the fuse 102 may be heated or even melt by an electrostatic discharge current flowing through the fuse 102. The electrostatic discharge current can be a sudden and momentary electric current that flows between two nodes at different electrical potentials when an electrostatic discharge event occurs. Electrostatic discharge events can be caused by static electricity. The static electricity can be generated through tribocharging, in which certain materials become electrically charged after they come into contact with another different material and are then separated. For example, the friction between two fuse circuits may result in tribocharging, thus creating different electrical potentials across the fuse. As a result, an electrostatic discharge current can flow through the fuse. As such, the fuse may be permanently damaged, which may cause detection errors of the states of the fuse.

Additionally, the resistance of the fuse 102 may vary because of process degradation, ambient temperature change, variation of supply voltage or fuse aging. The resistance of a blown fuse may decrease, such that the voltage drop across the fuse may decrease lower than the predetermined level $V_{THR}$, which result in a logic high signal at OUT. As such, inconsistent detection results of the fuse circuit may cause errors and decrease system robustness.

SUMMARY

A fuse circuit includes a fuse having an intact state and a blown state. The fuse can be switched to the blown state by enabling a blowing current to flow through the fuse. The fuse is coupled between a first transistor and a second transistor in series. The first transistor and the second transistor are complementary transistors and operable for reducing an electrostatic discharge current flowing through the fuse. The first transistor and the second transistor are turned on to enable the blowing current to flow through the fuse.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Embodiments in accordance with the present invention provide fuse circuits for blowing fuses and detecting states of the fuses. Advantageously, by coupling the fuse between two complementary transistors in series, undesirable electrostatic discharge current through the fuse can be reduced or eliminated.

Furthermore, a detection circuit coupled to the fuse provides adjustable reading current to the fuse and detects the states of the fuse according to a voltage drop across the fuse. Advantageously, the reading current can be adjusted under different circumstances to detect the states of the fuse in a relatively accurate way.

Figure 1:
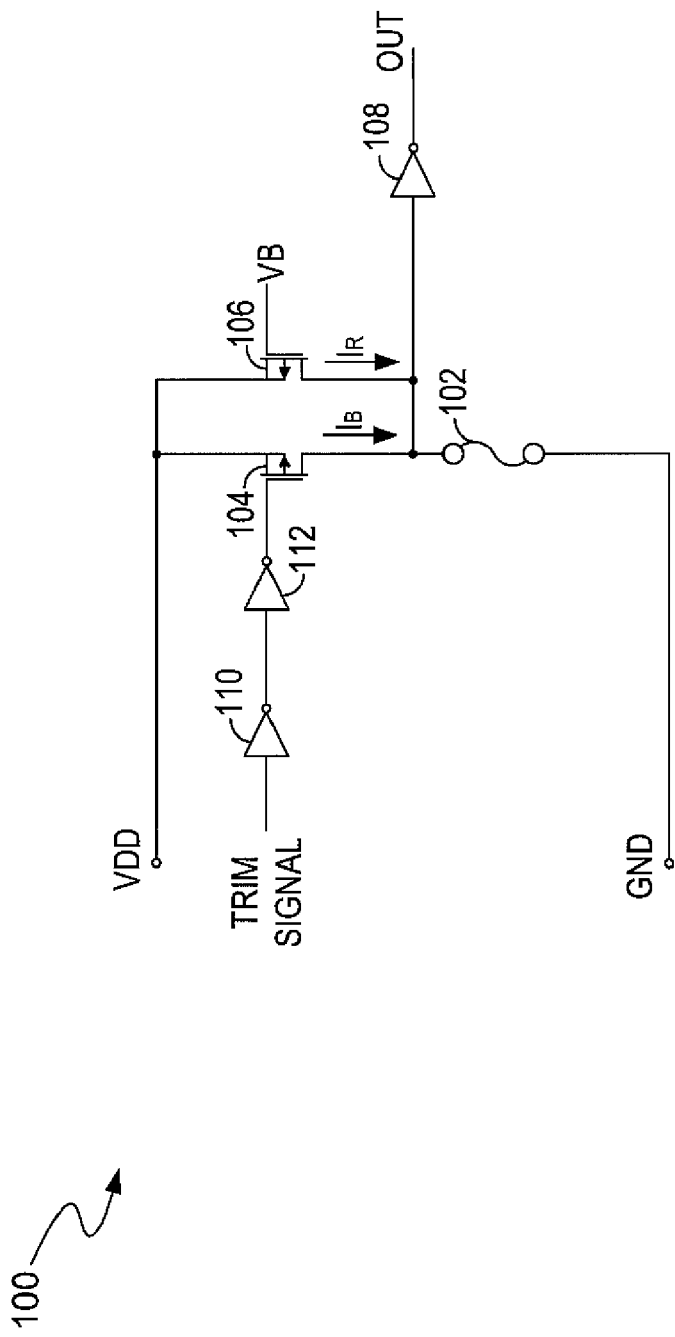
FIG. 1 illustrates a block diagram of a conventional fuse circuit.
Figure 2:
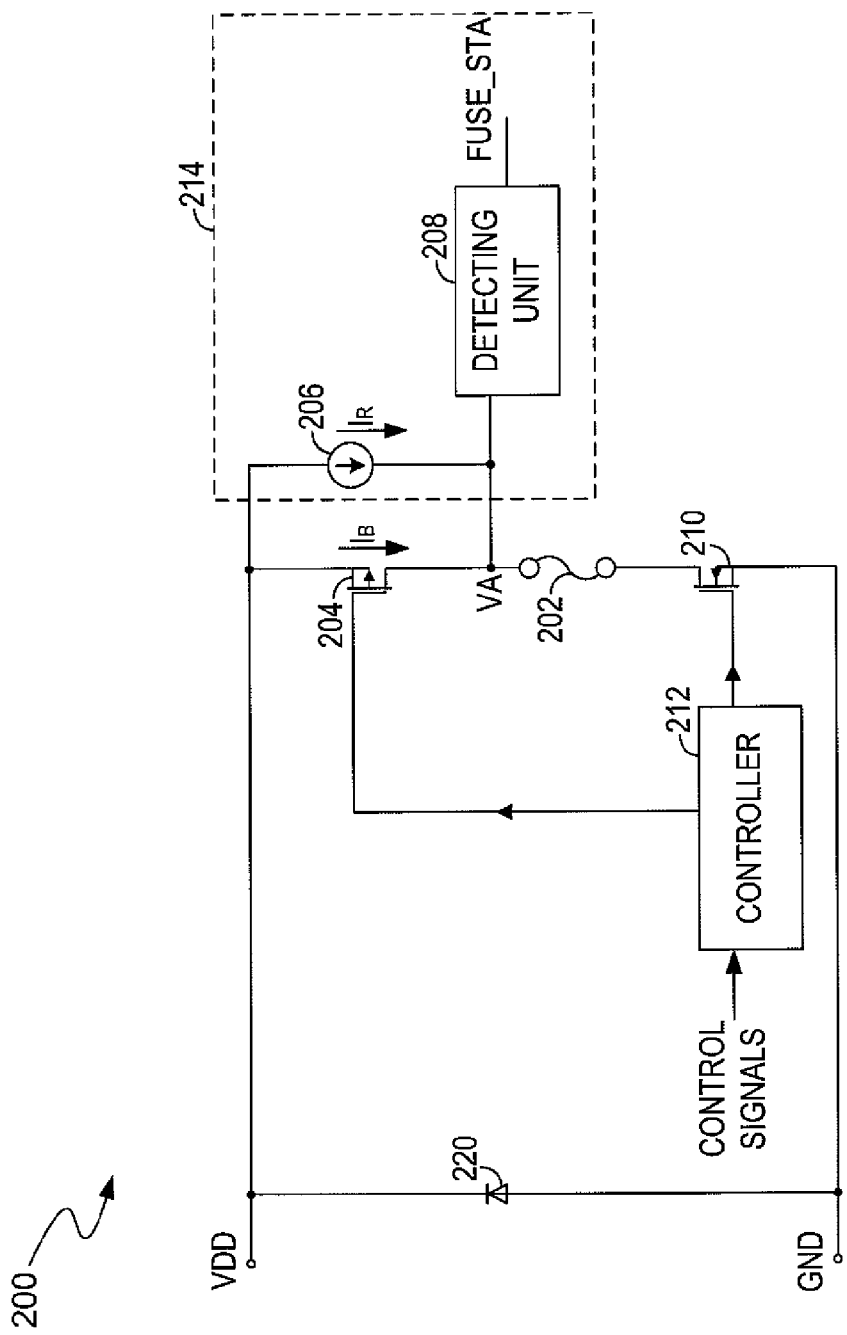
FIG. 2 illustrates a block diagram of a fuse circuit, in accordance with one embodiment of the present invention.

FIG. 2 illustrates a block diagram of a fuse circuit 200, in accordance with one embodiment of the present invention. The fuse circuit 200 can be used in many applications. For example, the fuse circuit 200 can be as a trimming circuit for providing signals in different states (e.g., digital signals) based on resistance of a fuse in the fuse circuit. The resistance of the fuse can vary based on a current flowing through the fuse. However, the invention is not so limited; the fuse circuit can be well-suited in other applications.

The fuse circuit 200 includes a fuse 202 having an intact state and a blown state. In the intact state, resistance of the fuse 202 can be less than a first predetermined value, e.g., 100Ω. In one embodiment, blowing a fuse means to force a current flowing through the fuse until the fuse melts. The fuse 202 can be blown by enabling a blowing current $I_B$ to flow through it, e.g., 100 mA. In the blown state, the resistance of the fuse 202 can be greater than a second predetermined value, e.g., 1MΩ.

In one embodiment, a transistor 204, e.g., a PMOS transistor, is coupled to a node of the fuse 202 for enabling the blowing current $I_B$ to flow through the fuse 202. A power supply can be connected to a source of the transistor 204 for providing an input voltage VDD to the transistor 204. A controller 212 is coupled to a gate of the transistor 204 to control the transistor 204.

Furthermore, a transistor 210, e.g., an NMOS transistor, is coupled to another node of the fuse 202. In one embodiment, the transistor 210 and the transistor 204 are complementary. The complementary transistors 204 and 210 can be two transistors of opposite conductivity type, e.g., a PMOS transistor and a NMOS transistor or a PNP transistor and an NPN transistor. However, the sizes of the transistors 204 and 210 need not be identical. A source of the transistor 210 is connected to ground. The controller 212 is coupled to a gate of the transistor 210 for controlling the transistor 210. Additionally, a diode 220 can be coupled between the input voltage VDD and ground for conducting a current flowing from a negative terminal (ground) to a positive terminal (input voltage VDD) through the diode 220 when an electrostatic discharge event occurs.

In one embodiment, the controller 212 can switch the transistor 204 and the transistor 210 on/off in response to multiple control signals. In one embodiment, the control signals can include a trimming signal. To blow the fuse 202, the trimming signal can be asserted to the controller 212. In response to the trimming signal, the controller 212 can turn on the transistor 204 and the transistor 210 to enable the blowing current $I_B$ to flow through the fuse 202. The controller 212 turns off the transistor 204 and the transistor 210 when the trimming signal is de-asserted.

The fuse circuit 200 further includes a detection circuit 214 coupled to the fuse 202 for detecting the states of the fuse 202 and generating a detection signal FUSE_STA indicative of the states of the fuse 202. In one embodiment, the detection circuit 214 can include a current source 206 and a detection unit 208. The current source 206 is coupled to the fuse 202 for providing a reading current $I_R$, e.g., 1 µA, to the fuse 202. In one embodiment, the reading current $I_R$ can be much smaller than the blowing current $I_B$. The detection unit 208 can detect a voltage drop across the fuse 202 and output the detection signal FUSE_STA according to the voltage drop.

In one embodiment, the control signals can further include a reading signal. To detect the states of the fuse 202 and output the detection signal FUSE_STA, the reading signal can be asserted to the controller 212. In response to the reading signal, the controller 212 can turn on the transistor 210 to enable the reading current $I_R$ to flow through the fuse 202. The transistor 204 is off. The controller 212 turns off the transistor 210 when the reading signal is de-asserted.

If an input voltage VDD is provided to the fuse circuit 200, the fuse circuit 200 can start to operate. The controller 212 can turn off the transistor 204 and the transistor 210 if no signal is asserted to the controller 212. In one embodiment, control signals such as the trimming signal and the reading signal are sent to the controller 212 at different time frames. If the trimming signal is asserted to the controller 212, the controller 212 can turn on the transistor 204 and the transistor 210 to enable the blowing current $I_B$ flowing through the fuse 202. As such, the fuse 202 can be blown by the blowing current $I_B$. When the transistor 204 and the transistor 210 are turned on, the reading current $I_R$ can also flow through the fuse 202. However, since the reading current $I_R$ is much smaller than the blowing current $I_B$, the reading current $I_R$ can be ignored. If the trimming signal is de-asserted, the controller 212 can turn off the transistor 204 and the transistor 210.

If the reading signal is asserted to the controller 212, the controller 212 can turn on the transistor 210 to enable the reading current $I_R$ to flow through the fuse 202. The transistor 204 is off. Since the voltage drop across the transistor 210 is relatively small when the transistor 210 is turned on, the voltage level at node VA, which is detected by the detection unit 208, can be approximately equal to the voltage drop across the fuse 202. If the reading signal is de-asserted, the controller 212 can turn off the transistor 210.

In one embodiment, the detection unit 208 can compare the voltage drop across the fuse 202 with a predetermined level $V_{THR}$, e.g., 1V, and generate the detection signal FUSE_STA according to the comparison result. If the voltage drop is higher than the predetermined level $V_{THR}$, the detection unit 208 can generate the detection signal FUSE_STA in a first state, e.g., logic low. If the voltage drop is lower than the predetermined level $V_{THR}$, the detection unit 208 can generate the detection signal FUSE_STA in a second state, e.g., logic high.

As such, if the fuse 202 is blown, the voltage drop across the fuse 202 can be higher than the predetermined value $V_{THR}$ since the resistance of the fuse 202 can be more than 1MΩ. Thus, the detection unit 208 can generate the detection signal FUSE_STA in the first state. If the fuse 202 is intact, the voltage drop across the fuse 202 can be lower than the predetermined value $V_{THR}$ since the resistance of the fuse 202 can be less than 100Ω. Thus, the detection unit 208 can generate the detection signal FUSE_STA in the second state.

Relative terms such as "high" and "low" in the context of the present invention do not preclude the use of opposite polarities or signal level conventions in alternative embodiment within the scope of the present invention.

In one embodiment, if the input voltage VDD is not available, electrical potentials at the source and the gate of the transistor 204 and the source and the gate of the transistor 210 can be substantially the same. If an electrostatic discharge event occurs, which can be caused by static electricity, the electrical potential at the source of the transistor 204 can be different from the electrical potential at the source of the transistor 210. The electrostatic discharge event causes the electrical potential at one node (e.g., source of the transistor 204) to vary while the electrical potential at the other node (e.g., source of the transistor 210) remains unchanged.

If the electrical potential at the source of the transistor 204 is higher than the electrical potential at the source of the transistor 210, e.g., when the electrical potential at the source of the transistor 204 increases, the voltage difference between the source and the gate of the transistor 204 may be higher than a source-gate threshold voltage of the transistor 204.

However, since the transistor 210 is complementary to the transistor 204, the electrical potentials at the source and the gate of the transistor 210 can be substantially the same. As such, the transistor 210 remains off to block the electrostatic discharge current.

When the electrical potential at the source of the transistor 210 decreases, the voltage difference between the gate and the source of the transistor 210 may be higher than a gate-source threshold voltage of the transistor 210. However, since the transistor 204 is complementary to the transistor 210, the electrical potentials at the source and the gate of the transistor 204 can be substantially the same. As such, the transistor 204 remains off to block the electrostatic discharge current.

If the electrical potential at the source of the transistor 204 is lower than the electrical potential at the source of the transistor 210, both transistors 204 and 210 are off and the electrostatic discharge current can be conducted through the diode 220.

Advantageously, the transistor 204 and the transistor 210, which are complementary transistors, can be respectively coupled between the input voltage VDD and the fuse 202, and between the fuse 202 and ground for blocking an electrostatic discharge current flowing through the fuse 202 if an electrostatic discharge event occurs. As such, the fuse 202 can be prevented from being blown when an electrostatic discharge event occurs, which can improve the stability of the fuse circuit.

Figure 3:
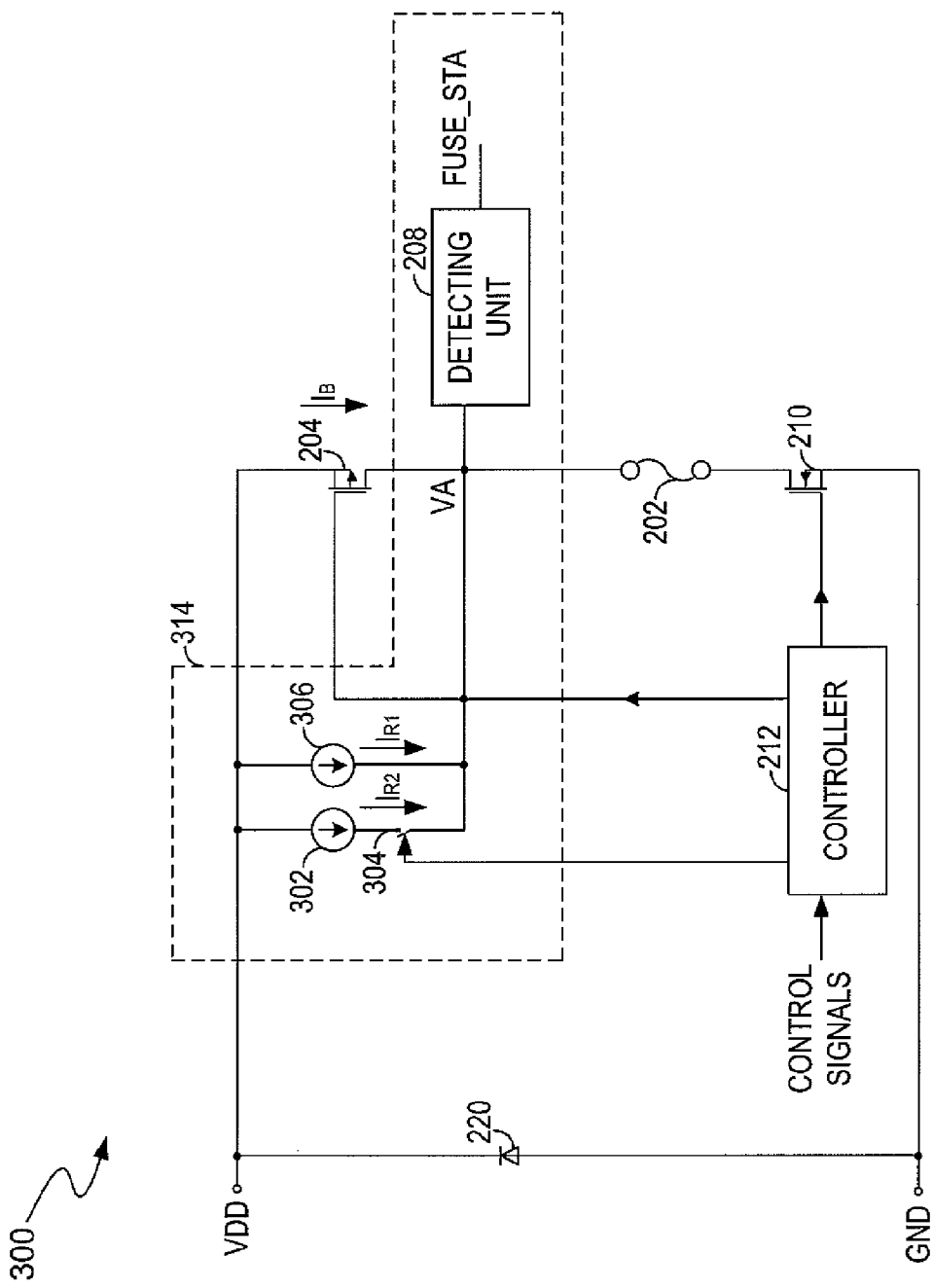
FIG. 3 illustrates a block diagram of another fuse circuit, in accordance with one embodiment of the present invention.

FIG. 3 illustrates a block diagram of another fuse circuit 300, in accordance with one embodiment of the present invention. Elements that are labeled the same as in FIG. 2 have similar functions.

In the fuse circuit 300, a detection circuit 314 can include a current source 306 coupled to the fuse 202 for providing a first reading current $I_{R1}$, e.g., 1 μA, and a current source 302 coupled to the fuse 202 for providing a second reading current $I_{R2}$, e.g., 0.5 μA, to the fuse 202. In one embodiment, the first reading current $I_{R1}$ and the second reading current $I_{R2}$ can be much smaller than the blowing current $I_B$. A switch 304 is coupled to the second current source 302 in series. The switch 304 can be controlled by the controller 212.

The controller 212 can control the transistor 204, the transistor 210 and the switch 304 in response to multiple control signals. In one embodiment, the control signals can include a trimming signal, a first reading signal and a second reading signal. The detection circuit 314 further includes the detection unit 208 to detect the voltage drop across the fuse 202 and output a detection signal FUSE_STA indicative of the states of the fuse 202 according to the voltage drop.

When an input voltage VDD is provided to the fuse circuit 300, the fuse circuit 300 can start to operate. During the operation, by asserting the trimming signal to the controller 212, the controller 212 can turn on the transistor 204 and the transistor 210 to enable the blowing current $I_B$ flowing through the fuse 202. The fuse 202 can be blown. The controller 212 turns off the transistor 204 and the transistor 210 if the trimming signal is de-asserted.

Furthermore, by asserting the first reading signal to the controller 212, the controller 212 can turn on the transistor 210 to enable the first reading current $I_{R1}$ flowing through the fuse 202. The transistor 204 is off. Thus, the detection unit 208 can detect the states of the fuse 202 according to the voltage drop across the fuse 202. The controller 212 turns off the transistor 210 if the first reading signal is de-asserted. Similarly, by asserting the second reading signal to the controller 212, the controller 212 can turn on the transistor 210 and the switch 304 to enable both of the first reading current $I_{R1}$ and the second reading current $I_{R2}$ flowing through the fuse 202. The transistor 204 is off. Thus, the detection unit 208 can detect the states of the fuse 202 according to the voltage drop across the fuse 202. The controller 212 turns off the transistor 210 and the switch 304 if the second reading signal is de-asserted.

Advantageously, the reading current flowing through the fuse 202 for detecting the states of the fuse 202 can be adjusted according to different circumstances. After trimming, the fuse circuit 300 can enter an automatic test equipment (ATE) testing phase. In the ATE testing phase, the states of the fuse 202 can be tested by an automatic test equipment, e.g., an automated device that is used to test printed circuit boards, integrated circuits, or other electronic components or modules. The ATE test is operable for checking whether the fuse 202 is blown after trimming. In one embodiment, the automatic test equipment can assert the first reading signal to the controller 212 for detecting whether the fuse 202 is blown. If the detection signal FUSE_STA output from the detection unit 208 indicates that the fuse 202 is still intact, the trimming signal can be asserted again to the controller 212 to blow the fuse 202. After passing the ATE testing, the fuse circuit 300 enters an application phase. For example, the fuse circuit 300 can be integrated into chips and used in various applications.

During the application phase, the resistance of the blown fuse 202 can be decreased tardily because of process degradation, ambient temperature change, variation of supply voltage or fuse aging. Advantageously, in the application phase, the second reading signal can be asserted to detect the states of the fuse 202. In response to the second reading signal, the controller 212 can turn on the transistor 210 and the switch 304 to enable both of the first reading current $I_{R1}$ and the second reading current $I_{R2}$ flowing through the fuse 202. Because the voltage drop across the fuse 202 can be equal to $(I_{R1}+I_{R2})*R_F$ ($R_F$ represents the resistance of the fuse 202), the second reading current $I_{R2}$ can provide an additional reading margin to compensate the resistance decrease of the fuse 202. Therefore, false detection results caused by resistance decrease of the fuse 202 can be avoided.

Figure 4:
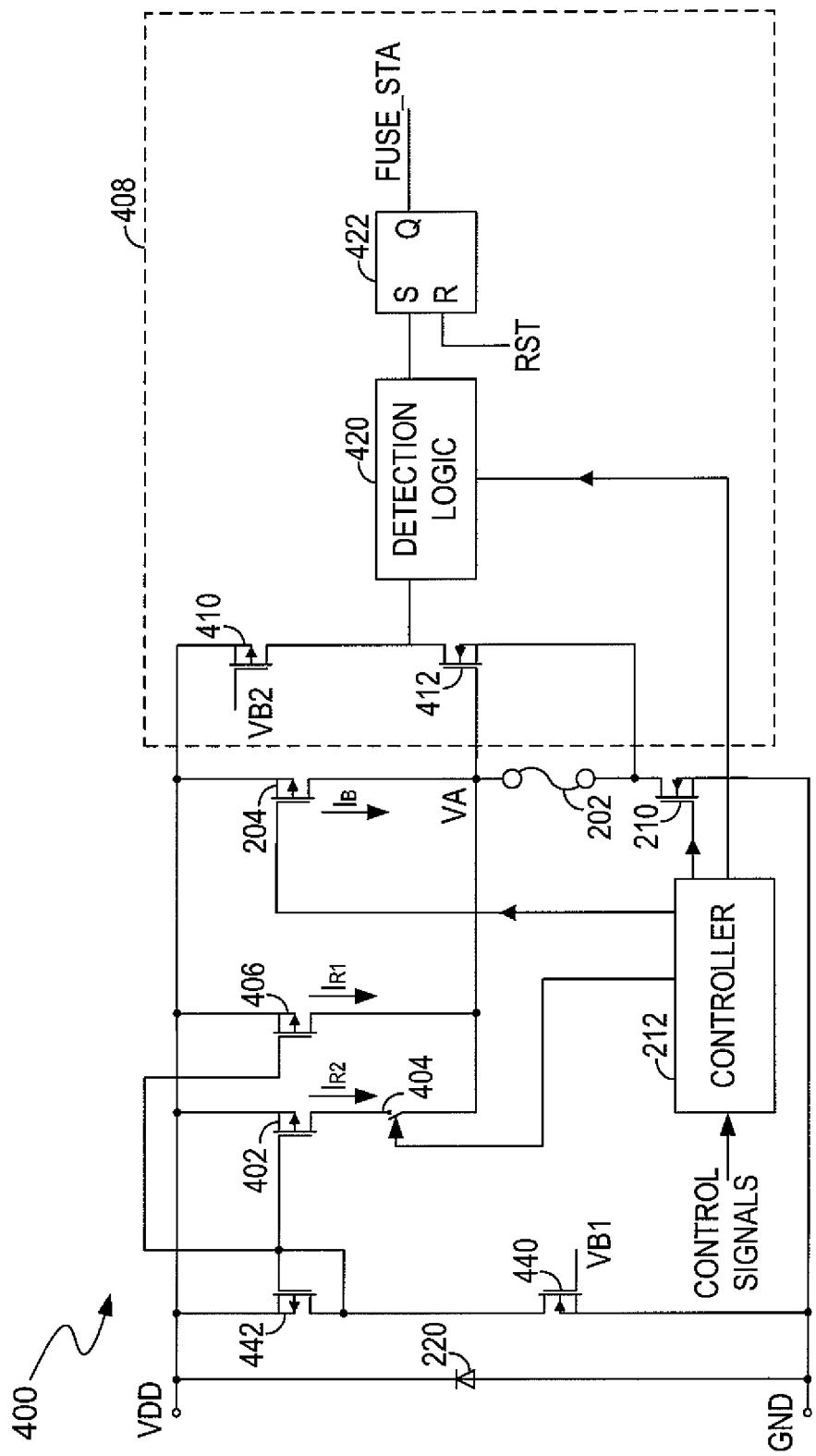
FIG. 4 illustrates a schematic diagram of a fuse circuit, in accordance with one embodiment of the present invention.

FIG. 4 illustrates a schematic diagram of a fuse circuit 400, in accordance with one embodiment of the present invention. Elements that are labeled the same as in FIG. 2 have similar functions.

In FIG. 4, transistors 402, 406 and 442 with their gates and sources connected together can form two current sources. The input voltage VDD can be provided to the sources of the transistor 402, 406 and 442. The transistors 402, 406 and 442 are matched or identical, in one embodiment. Therefore, source-gate voltages of the transistors 402, 406 and 442 can be substantially the same. In addition, the gate and drain of the transistor 442 are connected together.

The transistor 406 can provide a first reading current $I_{R1}$, e.g., 1 μA, to the fuse 202. The transistor 402 can provide a second reading current $I_{R2}$ e.g., 0.5 μA, to the fuse 202. In one embodiment, the first reading current $I_{R1}$ and the second reading current $I_{R2}$ can be much smaller than the blowing current $I_B$. Furthermore, a switch 404 is coupled to the transistor 402. The switch 404 can be controlled by the controller 212.

Similar to the fuse circuit 300 in FIG. 3, if the controller 212 turns on the transistor 210 in response to the first reading signal, the first reading current $I_{R1}$ can be enabled to flow through the fuse 202 to detect whether the fuse 202 is blown or intact. If the controller 212 turns on the transistor 210 and the switch 404 in response to the second reading signal, the first reading current $I_{R1}$ and the second reading current $I_{R2}$ can be both enabled to flow through the fuse 202. The second reading current $I_{R2}$ can provide an additional reading margin to compensate the decrease of the fuse resistance.

Additionally, a transistor 440 is coupled between the drain of the transistor 442 and ground for reducing or eliminating a quiescent current. The quiescent current is a standing current that flows into the fuse circuit when no signal is asserted to the controller 212. A bias voltage VB1 can be provided to a gate of the transistor 440 if the first reading signal or the second reading signal is input to the fuse circuit 400. If no reading signal is input to the fuse circuit 400, the gate of the transistor 440 can be connected to ground, thus turning off the transistor 440. As such, the quiescent current can be reduced or eliminated.

The fuse circuit 400 further includes a detection unit 408 to detect the states of the fuse 202 and generate a detection signal FUSE_STA indicative of the states of the fuse 202. In the detection unit 408, a gate and a source of a transistor 412 are coupled to two terminals of the fuse 202 respectively. A transistor 410, which can be used as an active load, is coupled between the transistor 412 and the input voltage VDD. A bias voltage VB2 is provided to a gate of the transistor 410. When the first reading current $I_{R1}$ or both first and second reading currents $I_{R1}$ and $I_{R2}$ flow through the fuse 202, the voltage drop across the fuse 202 can be higher than a source-gate threshold of the transistor 412 if the fuse 202 is blown. As such, the transistor 412 can be turned on. Since the transistor 210 is also turned on, a voltage drop across the transistors 210 and 412 can be relatively small. Thus, a drain voltage of the transistor 412 can be relatively low. If the fuse 202 is intact, the voltage drop across the fuse 202 can be lower than the source-gate threshold of the transistor 412. As such, the transistor 412 can be turned off and the drain voltage of the transistor 412 can be relatively high.

A detection logic 420 is coupled to the drain of the transistor 412 for generating logic signals according to the drain voltage of the transistor 412. The detection logic 420 can be controlled by the controller 212. In one embodiment, if the drain voltage of the transistor 412 is lower than a reference level, the detection logic 420 can generate a logic high signal. If the drain voltage of the transistor 412 is higher than the reference level, the detection logic 420 can generate a logic low signal.

A register 422, e.g., an RS register, can be coupled to the detection logic 420 for receiving the logic signals at an S pin. The RS register 422 can be toggled by a logic signal and output the detection signal FUSE_STA via a Q pin. The detection signal FUSE_STA can be latched by the RS register 422 until the RS register 422 is toggled by another logic signal. A reset signal can be input to an R pin of the RS register 422 for resetting the RS register 422 if necessary.

When the controller 212 turns on the transistor 210 to enable the first reading current $I_{R1}$ in response to the first reading signal, or turns on the transistor 210 and the switch 404 to enable both first reading current $I_{R1}$ and second reading current $I_{R2}$ in response to the second reading signal, the controller 212 can also generate an enabling signal $S_{ON}$ to enable the detection logic 420. In response to the enabling signal $S_{ON}$, the detection logic 420 can be enabled to detect the drain voltage of the transistor 412 and generate the logic signals to the RS register 422 according to the detected drain voltage.

If the fuse 202 is blown, the drain voltage of the transistor 412 can be lower than the reference level. The detection logic 420 can generate the logic high signal to the S pin of the RS register 422. In response to the logic high signal, the RS register 422 can be toggled to output the detection signal FUSE_STA in a first state. If the fuse 202 is intact, the drain voltage of the transistor 412 can be higher than the reference level. The detection logic 420 can generate the logic low signal to the S pin of the RS register 422. In response to the logic low signal, the RS register 422 can be toggled to output the detection signal FUSE_STA in a second state. In one embodiment, the detection signal FUSE_STA can be logic high if the fuse 202 is blown, and can be logic low if the fuse 202 is intact.

If the first reading signal or the second reading signal is de-asserted, the controller 212 can disable the detection logic 420 by de-asserting the signal $S_{ON}$. The detection signal FUSE_STA can be latched in the RS register 422.

Figure 5:
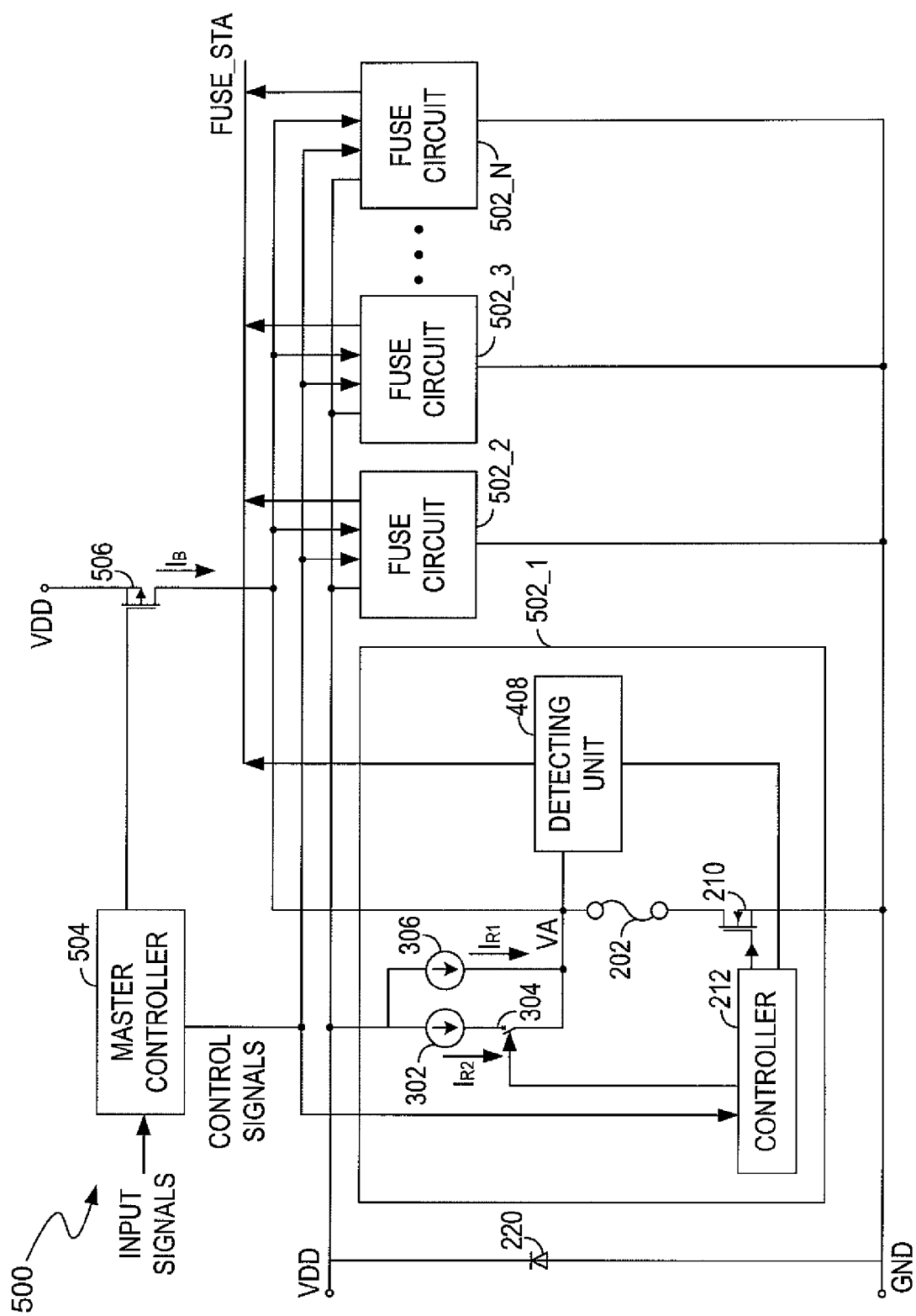
FIG. 5 illustrates a block diagram of a circuit including multiple fuse circuits, in accordance with one embodiment of the present invention.

FIG. 5 illustrates a block diagram of a circuit 500 including multiple fuse circuits, in accordance with one embodiment of the present invention. Elements that are labeled the same as in FIG. 2, FIG. 3 and FIG. 4 have similar functions.

In one embodiment, the circuit 500 (e.g., an integrated circuit) including multiple fuse circuits can be used to provide signals in different states, e.g., logic high and/or logic low, by selectively blowing the fuses of the fuse circuits and generating signals according to the states of the corresponding fuses.

The circuit 500 includes multiple fuse circuits coupled in parallel, e.g., fuse circuits 502_1-502_N. In one embodiment, the fuse circuits 502_1-502_N have similar structures as the fuse circuit 300 illustrated in FIG. 3. In a fuse circuit 502_1, the transistor 210, e.g., an NMOS transistor, is coupled to the fuse 202 in series for blocking undesirable current flowing through the fuse 202, e.g., an electrostatic discharge current. The current source 306 and the current source 302 are coupled to the fuse 202 for providing the first reading current $I_{R1}$ and the second reading current $I_{R2}$ to the fuse 202 respectively. The switch 304 is coupled between the current source 302 and the fuse 202. The detection unit 408 is coupled to the fuse 202 for detecting whether the fuse 202 is in the blown state or in the intact state, and generating the detection signal FUSE_STA indicative of the states of the fuse. The controller 212 is coupled to the transistor 210, the switch 304 and the detection unit 408 for controlling the transistor 210 and the switch 304 in response to multiple control signals. In one embodiment, the control signals can include a trimming signal, a first reading signal and a second reading signal.

The circuit 500 further includes a transistor 506, e.g., a PMOS transistor, coupled to the fuse circuits 502_1-502_N in series for providing the blowing current $I_B$ to the fuses in the fuse circuits 502_1-502_N. An input voltage VDD is provided to the source of the transistor 506. The electronic circuit 500 further includes a master controller 504 for controlling the transistor 506 and generating the control signals to the controllers in the fuse circuits 502_1-502_N according to multiple input signals.

In one embodiment, when a first input signal (trimming enable signal) is asserted to the master controller 504, a bit sequence signal can be also input to the master controller 504. In response to the first input signal, the master controller 504 can determine which fuses need to be blown based on the bit sequence signal. For example, assume that the circuit 500 includes ten fuse circuits. When the first input signal is asserted to the master controller 504, a bit sequence signal 0111000110 can be also input to the master controller 504. The master controller 504 can select the second, the third, the fourth, the eighth and the ninth fuse circuits as the target fuse circuits according to the bit sequence signal 0111000110.

The master controller 504 can turn on the transistor 506 and generate the trimming signals to the controllers in the target fuse circuits in sequence. In one embodiment, the master controller 504 generates the trimming signal to the first target fuse circuit, e.g., the fuse circuit 502_1, for a predetermined duration. The controller of the first target fuse circuit can turn on the transistor 210 in response to the trimming signal. As such, the blowing current $I_B$ can be enabled to flow through the fuse 202 for the predetermined duration to blow the fuse 202. After the predetermined duration, the master controller 504 can de-assert the trimming signal to the first target fuse circuit. Subsequently, the master controller 504 can generate the trimming signal to the next target fuse circuit for the predetermined duration. As such, the controllers of the target fuse circuits can receive the trimming signals for the predetermined duration sequentially. Thus, the fuses of the target fuse circuits can be blown in sequence.

In one embodiment, when a second input signal is asserted to the master controller 504, the master controller 504 can generate first reading signals to the controllers of the fuse circuits 502_1-502_N in sequence.

In one embodiment, the master controller 504 generates the first reading signal to the first fuse circuit, e.g., the fuse circuit 502_1, for a predetermined duration. In response to the first reading signal, the controller of the first fuse circuit 502_1 can turn on the transistor 210. The first reading current $I_{R1}$ can be enabled to flow through the fuse 202. The controller of the first fuse circuit 502_1 can enable the detection unit 408 to detect the state of the fuse 202. The detection unit 408 can generate the detection signal FUSE_STA indicative of the state of the fuse 202 according to the voltage drop across the fuse 202. After the predetermined duration, the master controller 504 can de-assert the first reading signal to the first fuse circuit. Subsequently, the master controller 504 can generate the first reading signal to the next fuse circuit for the predetermined duration. As such, the controllers of the fuse circuits 502_1-502_N can receive the first reading signals for the predetermined duration sequentially. Thus, the fuse circuits 502_1-502_N can output the detection signals indicative of the states of the corresponding fuses in sequence.

In one embodiment, when a third input signal is asserted to the master controller 504, the master controller 504 can generate second reading signals to the controllers of the fuse circuits 502_1-502_N in sequence.

In one embodiment, the master controller 504 generates the second reading signal to the first fuse circuit, e.g., the fuse circuit 502_1, for a predetermined duration. In response to the second reading signal, the controller of the first fuse circuit 502_1 can turn on the transistor 210 and the switch 304 to enable both of the first reading current $I_R$ and the second reading current $I_{R2}$ to flow through the fuse 202. The controller of the first fuse circuit 502_1 can enable the detection unit 408 to detect the state of the fuse 202. The detection unit 408 can generate the detection signal FUSE_STA indicative of the state of the fuse 202 according to the voltage drop across the fuse 202. After the predetermined duration, the master controller 504 can de-assert the second reading signal to the first fuse circuit. Subsequently, the master controller 504 can generate the second reading signal to the next fuse circuit for the predetermined duration. As such, the controllers of the fuse circuits 502_1-502_N can receive the second reading signals for the predetermined duration sequentially. Thus, the fuse circuits 502_1-502_N can output the detection signals indicative of the states of the corresponding fuses in sequence.

Advantageously, the blowing current $I_B$ can be enabled to flow through each target fuse for a certain period. As such, the current flowing through each target fuse can be large enough to blow the fuse. Additionally, the transistor 202 and the switch 304 of each fuse circuit can be turned on to enable the reading currents $I_{R1}$ and $I_{R2}$ to flow through each fuse for a certain period. Since the states of the fuses can be detected individually and sequentially, the detection results can be relatively accurate.

Figure 6:
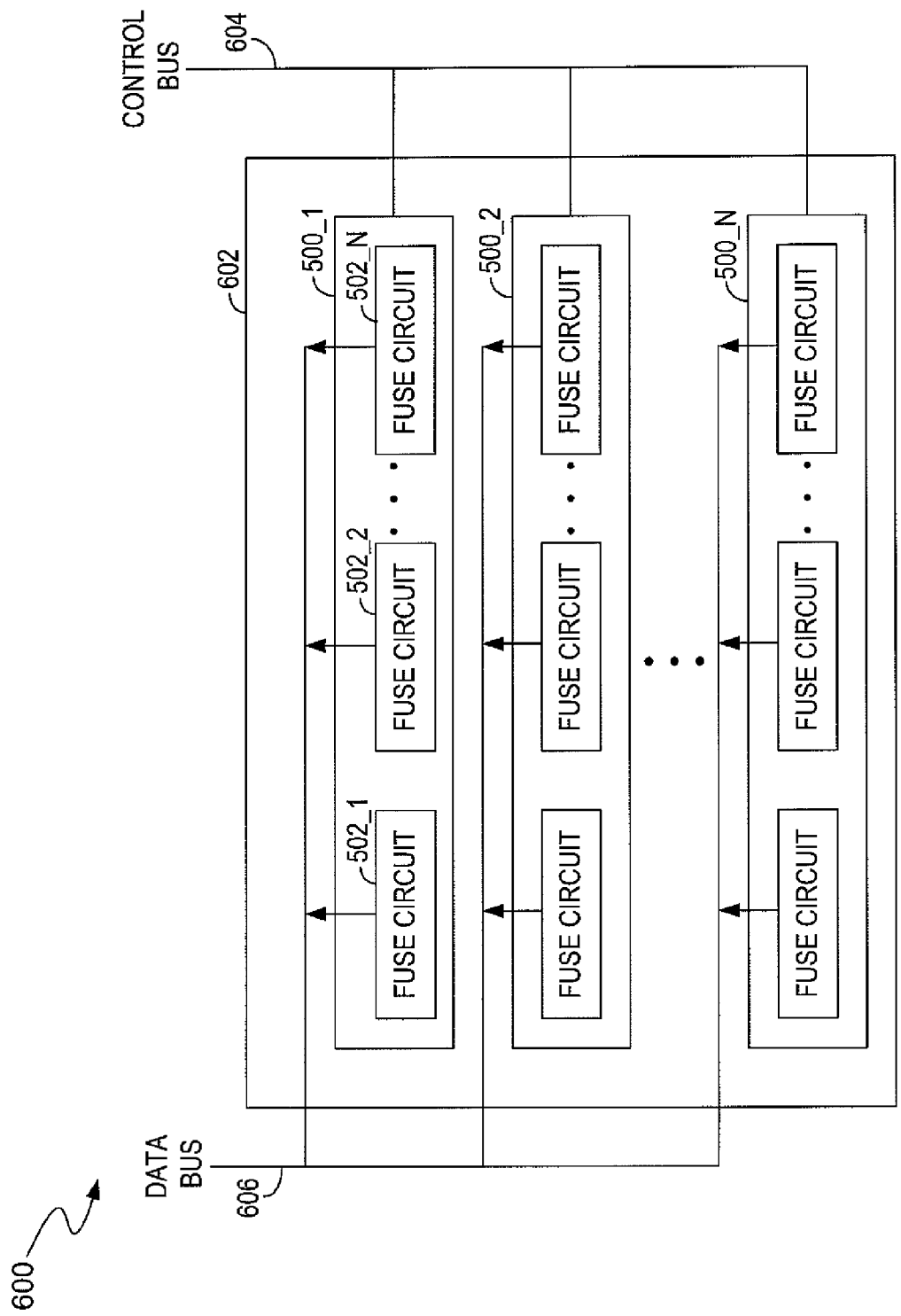
FIG. 6 illustrates a block diagram of a firmware including multiple fuse circuits for storing data, in accordance with one embodiment of the present invention.

FIG. 6 illustrates a block diagram 600 of a firmware including multiple fuse circuits for storing data, in accordance with one embodiment of the present invention. Elements that are labeled the same as in FIG. 5 have similar functions. The firmware can be used in various electronic devices or systems, e.g., mobile phones, computers, digital cameras, etc.

In the example of FIG. 6, a firmware 602 includes multiple integrated circuits 500_1-500_N. In one embodiment, the integrated circuits 500_1-500_N have similar structures as the circuit 500 illustrated in FIG. 5. A control bus 604 is coupled to the integrated circuits 500_1-500_N for asserting the input signals to the integrated circuits 500_1-500_N respectively. A data bus 606 is coupled to the integrated circuit 500_1-500_N for receiving the detection signals from the fuse circuits 502_1-502_N in each of the integrated circuits 500_1-500_N respectively.

Data or instructions can be written into the firmware 602. In one embodiment, to write an instruction which can be represented by a bit flow, e.g., 0011000011101011001000011101000111 0, into the firmware 602, the control bus can assert the first input signals (trimming enable signals) and the bit sequence signals to the integrated circuits 500_1-500_N respectively based on the bit flow of the instruction. In response, each integrated circuit can select the target fuse circuit(s) from the fuse circuits 502_1-502_N based on the corresponding bit sequence signal, and assert the trimming signals to the target fuse circuit(s) respectively to blow the corresponding fuses.

After trimming, the firmware 602 can enter the ATE testing phase. The control bus 604 can assert the second input signals to the integrated circuits 500_1-500_N respectively and sequentially to test the states of the fuses thereof. In response, each integrated circuit can assert the first reading signals to the fuse circuits 502_1-502_N respectively and sequentially. In response to the first reading signals, the fuse circuits 502_1-502_N can detect the states of the corresponding fuses and generate the detection signals to the data bus 606 in sequence.

When the firmware 602 enters the application phase, the control bus 604 can assert a third input signal to the integrated circuits 500_1-500_N respectively and sequentially to read the data or instructions stored in the firmware 602. In response, each integrated circuit can assert the second reading signals to the fuse circuits 502_1-502_N respectively and sequentially. In response to the second reading signal, the fuse circuits 502_1-502_N can detect the states of the corresponding fuses and generate the detection signals to the data bus 606 in sequence. In one embodiment, the detection signals can be digital signals representing the data or instructions stored in the firmware 602.

Figure 7:
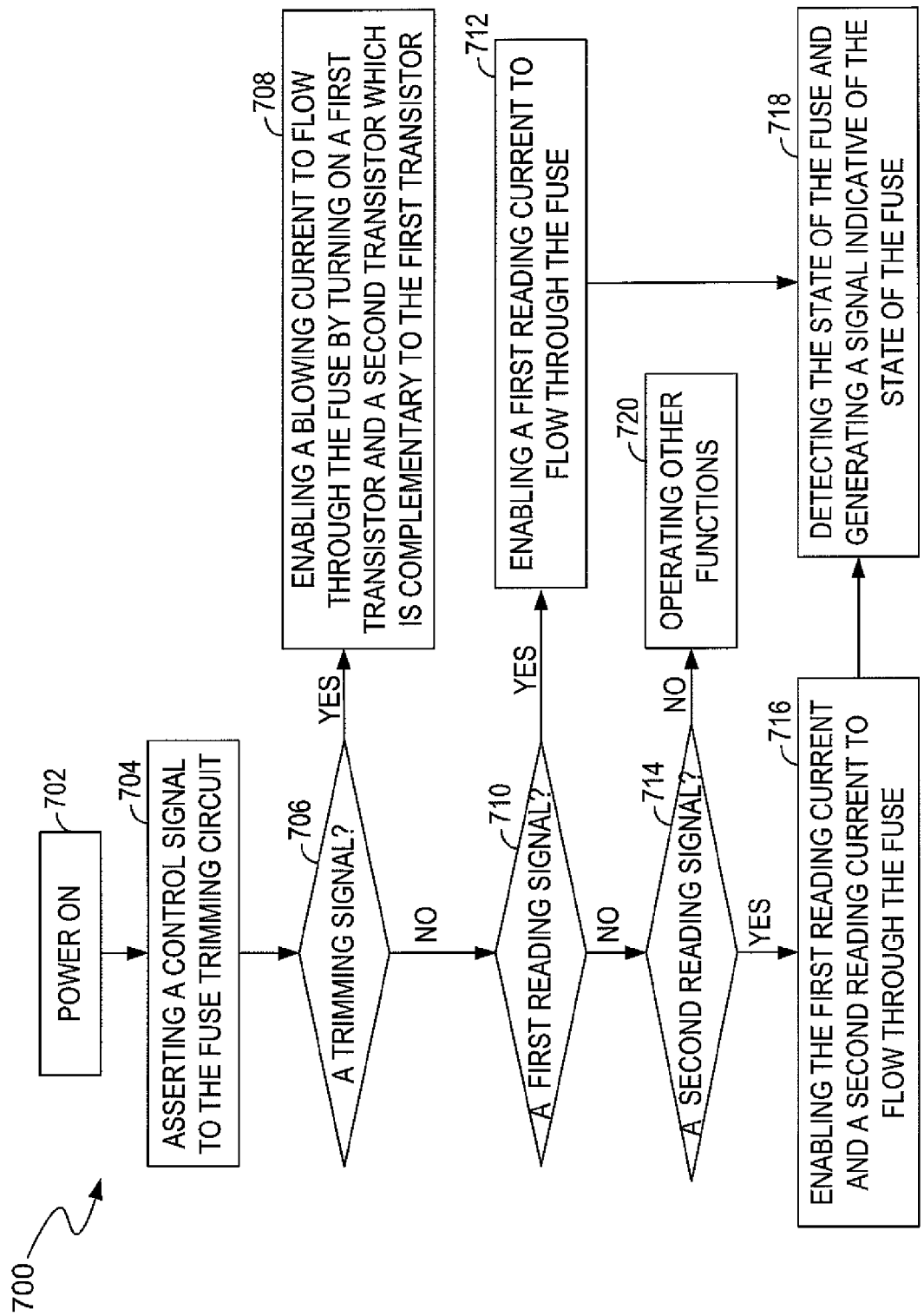
FIG. 7 illustrates a flowchart of operations performed by a fuse circuit, in accordance with one embodiment of the present invention.

FIG. 7 illustrates a flowchart 700 of operations performed by a fuse circuit, e.g., a fuse circuit 300 in the FIG. 3, in accordance with one embodiment of the present invention. FIG. 7 is described in combination with FIG. 2 and FIG. 3. Although specific steps are disclosed in FIG. 7, such steps are examples. That is, the present invention is well suited to performing various other steps or variations of the steps recited in FIG. 7.

The fuse circuit 300 is powered on in block 702. In block 704, a control signal can be asserted to the fuse circuit 300. In block 706, if the control signal is a trimming signal, the flowchart 700 goes to block 708. Otherwise, the flowchart 700 goes to block 710. In block 708, a blowing current $I_B$ can be enabled to flow through a fuse 202 by turning on a first transistor 204 and a second transistor 210 which is complementary to the first transistor 204. As such, the fuse 202 can be blown by the blowing current $I_B$.

In block 710, if the control signal is a first reading signal, the flowchart 700 goes to block 712. Otherwise, the flowchart 700 goes to block 714. In block 712, a first reading current $I_{R1}$ can be enabled to flow through the fuse 202 by turning on the second transistor 210. The detection unit 408 can be enabled to detect a state of the fuse 202 according to a voltage drop across the fuse 202 and generate a detection signal indicative of the state of the fuse 202 in block 718.

In block 714, if the control signal is a second reading signal, the flowchart 700 goes to block 716. Otherwise, the flowchart 700 goes to block 720. In block 716, the first reading current $I_{R1}$ and a second reading current $I_{R2}$ can be enabled to flow through the fuse 202 by turning on the second transistor 210 and a switch 304. The detection unit 408 can be enabled to detect the state of the fuse 202 according to the voltage drop across the fuse 202 and to generate the detection signal indicative of the state of the fuse 202 in block 718. In block 720, the fuse circuit 300 may operate other functions.

Accordingly, embodiments in accordance with the present invention provide fuse circuits for blowing fuses and detecting states of the fuses. The fuse circuit includes a fuse having an intact state and a blown state. The fuse can be switched to the blown state by enabling a blowing current to flow through the fuse. The fuse circuit further includes a first transistor coupled between a power source and the fuse and a second transistor coupled between the fuse and ground. The first transistor and the second transistor are complementary transistors and operable for reducing or blocking an electrostatic discharge current flowing through the fuse. The first transistor and the second transistor can be turned on to enable the blowing current to flow through the fuse.

Furthermore, a detection circuit is coupled to the fuse operable for detecting the states of the fuse and generating a detection signal indicating the states of the fuse. The detection circuit can include a first current source coupled to the fuse for providing a first reading current to the fuse and a second current source coupled to the fuse for providing a second reading current to the fuse. A switch can be coupled between the second current source and the fuse. The detection circuit can further include a detection unit coupled to the fuse for detecting a voltage drop across the fuse and generating the detection signal according to the voltage drop.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. A fuse circuit comprising:
    a fuse having an intact state and a blown state, wherein said fuse is in said blown state if a blowing current flows through said fuse;
    a first transistor coupled between a power source and said fuse;
    a second transistor complementary to said first transistor and coupled between said fuse and ground;
    a third transistor comprising a gate coupled to a first terminal of said fuse and a source coupled to a second terminal of said fuse and for detecting a voltage drop across said fuse; and
    a reading current source coupled to said fuse and for providing a reading current flowing through said fuse to generate said voltage drop,
    wherein said reading current is adjusted according to said intact and blown states, wherein said first transistor and said second transistor are turned on for enabling said blowing current to flow through said fuse, and wherein said first transistor and said second transistor are for reducing an electrostatic discharge current flowing through said fuse.

2. The fuse circuit of claim 1, further comprising:
    a detection circuit comprising said third transistor and for detecting said states of said fuse and generating a detection signal indicative of said states of said fuse.

3. The fuse circuit of claim 2, wherein said detection circuit generates said detection signal in a first state if said fuse is in said intact state, and generates said detection signal in a second state if said fuse is in said blown state.

4. The fuse circuit of claim 1, further comprising
    a first current source coupled to said fuse and for providing a first current flowing through said fuse, wherein said reading current comprises said first current, and wherein said first current is less than said blowing current; and
    a detection circuit comprising said third transistor and for detecting said voltage drop across said fuse based on said first current, and generating a detection signal indicative of said states of said fuse according to said voltage drop.

5. The fuse circuit of claim 4, wherein said detection circuit generates said detection signal in a first state if said voltage drop is higher than a predetermined level, and generates said detection signal in a second state if said voltage drop is lower than said predetermined level.

6. The fuse circuit of claim 4, further comprising:
    a controller coupled to said first transistor and said second transistor, and for controlling said first transistor and said second transistor,
    wherein said controller turns on said first transistor and said second transistor to enable said blowing current to flow through said fuse, and wherein said controller turns off said first transistor and turns on said second transistor to enable said first current to flow through said fuse.

7. The fuse circuit of claim 4, further comprising:
    a second current source coupled to said fuse and for providing a second current to said fuse, wherein said reading current further comprises said second current, and wherein said second current is less than said blowing current; and
    a switch coupled to said second current source in series.

8. The fuse circuit of claim 7, further comprising:
    a controller coupled to said first transistor, said second transistor and said switch and for turning on said first transistor and said second transistor to enable said blowing current to flow through said fuse, for turning off said first transistor and turning on said second transistor to enable said first current to flow through said fuse, and for turning off said first transistor and turning on said second transistor and said switch to enable both said first current and said second current to flow through said fuse.

9. An electronic circuit comprising:
    a plurality of fuse circuits coupled in parallel, each of said fuse circuits comprising:

a fuse having an intact state and a blown state, wherein said fuse is in said blown state if a blowing current flows through said fuse;
a first transistor coupled between said fuse and ground;
a second transistor comprising a gate coupled to a first terminal of said fuse and a source coupled to a second terminal of said fuse and for detecting a voltage drop across said fuse; and
a reading current source coupled to said fuse and for providing a reading current flowing through said fuse to generate said voltage drop, wherein said reading current is adjusted according to said intact and blown states;
a third transistor coupled between a power source and said fuse circuits and for enabling said blowing current to flow through said fuse in each of said fuse circuits, wherein said first transistor and said third transistor are complementary transistors and for reducing an electrostatic discharge current flowing through said fuse; and
a master controller coupled to said fuse circuits and said third transistor and for controlling said fuse circuits and said third transistor.

10. The electronic circuit of claim 9, wherein said master controller is capable of selecting a plurality of target fuse circuits from said fuse circuits based on a sequence signal, generating a control signal to each of said target fuse circuits and turning on said third transistor, and wherein said first transistor in each of said target fuse circuits is turned on to enable said blowing current to flow through a corresponding fuse in response to said control signal.

11. The electronic circuit of claim 9, wherein each of said fuse circuits further comprises:
a detection circuit comprising said second transistor and for detecting said states of said fuse and generating a detection signal indicative of said states of said fuse.

12. The electronic circuit of claim 11, wherein said detection circuit generates said detection signal in a first state if said fuse is in said intact state, and generates said detection signal in a second state if said fuse is in said blown state.

13. The electronic circuit of claim 9, wherein each of said fuse circuits further comprises:
a first current source coupled to said fuse and for providing a first current to said fuse, wherein said reading current comprises said first current, and wherein said first current is less than said blowing current; and
a detection circuit comprising said second transistor and for detecting said voltage drop of said fuse, and generating a detection signal indicative of said states of said fuse according to said voltage drop.

14. The electronic circuit of claim 13, wherein said detection circuit generates said detection signal in a first state if said voltage drop is higher than a predetermined level, and generates said detection signal in a second state if said voltage drop is lower than said predetermined level.

15. The electronic circuit of claim 13, wherein each of said fuse circuits further comprises:
a second current source coupled to said fuse and for providing a second current to said fuse, wherein said reading current further comprises said second current, and wherein said second current is less than said blowing current; and
a switch coupled to said second current source in series.

16. The electronic circuit of claim 13, wherein said master controller is capable of generating a control signal to each of said fuse circuits in sequence, wherein said first transistor in each of said fuse circuits is turned on in response to said control signal to enable said first current to flow through a corresponding fuse.

17. A method comprising:
turning on a first transistor and a second transistor complementary to said first transistor;
enabling a blowing current to flow through a fuse coupled between said first and second transistors in series;
blowing said fuse according to said blowing current;
reducing an electrostatic discharge current flowing from said fuse by turning off said first transistor and said second transistor;
enabling a reading current to flow through said fuse, wherein said reading current is adjusted according to said intact and blown states; and
detecting a voltage drop across said fuse by a third transistor based on said reading current, wherein said third transistor comprises a gate coupled to a first terminal of said fuse and a source coupled to a second terminal of said fuse.

18. The method of claim 17, further comprising:
enabling a first current to flow through said fuse, wherein said reading current comprises said first current, and wherein said first current is less than said blowing current; and
generating a detection signal indicating whether said fuse is blown based on said first current.

19. The method of claim 18, wherein said generating said detection signal further comprises:
detecting said voltage drop across said fuse based on said first current;
generating said detection signal in a first state if said voltage drop is higher than a predetermined level; and
generating said detection signal in a second state if said voltage drop is lower than said predetermined level.

20. The method of claim 17, further comprising:
enabling a first current and a second current to flow through said fuse, wherein said reading current comprises said first current and said second current, and wherein said first current is less than said blowing current and said second current is less than said blowing current; and
generating a detection signal indicating whether said fuse is blown based on said first current and said second current.

21. The method of claim 20, wherein said generating said detection signal further comprises:
detecting said voltage drop across said fuse based on said first current and said second current;
generating said detection signal in a first state if said voltage drop is higher than a predetermined level; and
generating said detection signal in a second state in said voltage drop is lower than said predetermined level.

22. The fuse circuit of claim 1, wherein said reading current has a first level for detecting said states of said fuse, and wherein said reading current has a second level that is greater than said first level and for improving accuracy of detecting of said states of said fuse.

* * * * *